United States Patent [19]

Xi et al.

[11] Patent Number: 5,926,743

[45] Date of Patent: Jul. 20, 1999

[54] PROCESS FOR CHLORINE TRIFLUORIDE CHAMBER CLEANING

[75] Inventors: Ming Xi, Santa Clara, Calif.; Kazuhiro Nishina, Inbagun, Japan; Steve Chen, Fremont, Calif.; Toshiaki Fujita, Sakura, Japan

[73] Assignee: Applied Materials, Inc., Santa Clara, Calif.

[21] Appl. No.: 09/146,080

[22] Filed: Sep. 2, 1998

Related U.S. Application Data

[62] Division of application No. 08/805,459, Feb. 25, 1997, Pat. No. 5,849,092.

[51] Int. Cl.$^6$ .............................. C23C 16/00; B08B 9/00
[52] U.S. Cl. ........................ 438/905; 438/115; 134/1.1; 134/1.2; 134/21.1
[58] Field of Search .................................... 438/905, 115; 29/25.01; 134/1.1, 1.2, 22.1, 31, 35, 36, 37; 216/67

[56] References Cited

U.S. PATENT DOCUMENTS

| | | | |
|---|---|---|---|
| 5,158,644 | 10/1992 | Cheung et al. | 438/694 |
| 5,486,235 | 1/1996 | ye et al. | 438/905 |
| 5,584,963 | 12/1996 | Takahashi | 134/22.1 |
| 5,609,721 | 3/1997 | Tsukune et al. | 134/22.11 |
| 5,817,578 | 10/1998 | Ogawa | 438/905 |

Primary Examiner—Jill Warden
Assistant Examiner—Saeed Chaudhry
Attorney, Agent, or Firm—Blakely Sokoloff Taylor & Zafman

[57] ABSTRACT

A method and apparatus for removing particles and residue that build up inside a substrate processing system during a substrate processing operation, without overetching system components, is described. One method includes the steps of: flowing an etchant gas comprising chlorine trifluoride ($ClF_3$), diluted with an inert carrier gas, into a processing chamber after completion of the substrate processing operation. The parts of the system within the chamber with the greatest amount of build-up are preferentially heated to facilitate more extensive cleaning of those parts. Parts of the system within the chamber with less build up are protected from overetching by keeping them about 200° C. cooler than the heavily-deposited parts. Heating the heavily-deposited chamber parts to a temperature of at least about 400° C. allows using a lower concentration of etchant gas for the cleaning process than a lower temperature process would allow. The etchant gas reacts with both particles and residue in the chamber, reducing both particulate-related defects and deposition build-up. Another method includes blanketing lightly-deposited areas of the chamber with a nonreactive gas to displace and dilute the etchant gas from these areas for part of the cleaning process, while heavily-deposited areas are exposed to a higher concentration of the etchant gas for a longer period of time. The blanketing gas is turned off for another part of the cleaning process so that these areas are also cleaned.

5 Claims, 7 Drawing Sheets

PROCESS FOR CHLORINE TRIFLUORIDE CHAMBER CLEANING

This is a divisional application of Ser. No.: 08/805,459 filed Feb. 25,1997, now U.S. Pat. No. 5,849,092.

BACKGROUND OF THE INVENTION

The present invention relates to the fabrication of integrated circuits. More particularly, the invention provides a technique, including a method and apparatus, for removing particle and residue build-up that occurs during substrate processing. The present invention is particularly useful for chemical vapor deposition processing, but may also be applied to plasma etching and other substrate processing techniques.

One of the primary steps in the fabrication of modern semiconductor devices is the formation of a thin film on a semiconductor substrate by chemical reaction of vapor precursors. Such a deposition process is referred to as chemical vapor deposition or CVD. Conventional thermal CVD processes supply reactive gases to the substrate surface where heat-induced chemical reactions take place to form a thin film layer over the surface of the substrate being processed. One particular thermal CVD application is the deposition of tungsten or a tungsten-containing compound, such as tungsten silicide, over a semiconductor substrate from a process gas that includes tungsten hexafluoride and dichlorosilane or silane, and/or hydrogen and other gases. Such a process is often used in deposition of a conductive layer, or as part of the deposition process of interconnects between one conductive layer and either the substrate or another conductive layer, or within one layer.

However, deposition occurs throughout the chamber, and not just on the substrate. The heaviest depositions occur in the hottest areas of the chamber, which is typically in the area of the substrate, but some deposition occurs in other areas, even fairly cool areas or areas not directly exposed to the vapor precursors.

These depositions can cause a number of problems. For example, they can clog fine holes in gas nozzles, disrupting an even flow of gas and affecting process uniformity. Or, they may cloud chamber windows, affecting the ability to see into the chamber. Additionally, they may form particulates, which can fall on the substrate to cause a defect in the deposited layer, or even interfere with the mechanical operation of the deposition system.

To avoid such problems, the inside surface of the chamber is cleaned regularly to remove the unwanted deposition material from the chamber walls and similar areas of the processing chamber. Such cleaning procedures are commonly performed between deposition steps for every wafer or every n wafers. One type of procedure involves disassembling the chamber and cleaning each part using a solution or solvent, then drying and reassembling the system. This procedure is labor-intensive and time-consuming, reducing wafer fabrication line efficiency and increasing costs.

Another common technique uses a plasma to promote excitation and/or dissociation of reactive gases by the application of radio frequency (RF) energy. In these techniques, a plasma of highly reactive species is created that reacts with, and etches away, the unwanted deposition material from the chamber walls and other areas. However, the plasma is generally contained within a bounded area of the chamber, and does not promote cleaning in areas outside of the plasma boundaries, such as the backside of a wafer holder, that may also require cleaning.

Another common problem with this technique is that many of the etchant gases employed in the plasma cleaning processes are perfluorocompounds or "PFC's", for short. Some of the more commonly used PFC's include $CF_4$, $CF_6$, $NF_3$ and $SF_6$ or similar gases. These gases are known to have a long lifetime (up to 50,000 years for $CF_4$), and are also believed to degrade the earth's ozone layer. Thus, the release of PFC's into the atmosphere is potentially damaging and has become the subject of government and other regulations. Accordingly, it is important to reduce PFC emissions from semiconductor processing equipment such as CVD reaction chambers. Furthermore, a plasma-assisted cleaning process assumes that the chamber is configured to generate a plasma. Many chambers are not configured for plasma generation and cannot use this technique.

Molecular fluorine ($F_2$) and chlorine trifluoride ($ClF_3$) are examples of some non-PFC gases that have been employed as etchant gases in clean operations without plasma assistance. Molecular fluorine is a highly corrosive and dangerous gas that requires special measures, such as the use of double-walled tubing, to maintain proper safety levels. Diluted chlorine trifluoride has been used at relatively low temperatures around 300° C. However, these low-temperature cleaning processes take a relatively long time. First, because the deposition processes typically take place at about 300° C., the system must first be cooled down from, and then heated up to, the processing temperature. The greater the temperature difference is between the processing temperature and the cleaning temperature, the longer this takes. Also, because the cleaning rate increases with increasing temperature, a lower cleaning temperature requires a longer cleaning time for a fixed concentration of $ClF_3$. Otherwise, a higher concentration of $ClF_3$ must be used, which is more expensive and results in more waste products.

Because deposition typically occurs faster in the hotter areas of the chamber, and because the chamber temperature is not uniform, the build-up of deposits is not uniform throughout the chamber. Merely admitting a highly corrosive gas into the chamber for a period long enough to remove the heaviest deposits might overetch the areas with light deposits. While it is undesirable to overetch any chamber component, some chamber components, such as windows or fine nozzles, are especially vulnerable to attack by the etchant gases. The present cleaning processes utilizing $F_2$ or $ClF_3$ do not protect against overetching chamber components with light deposits. Overetching may result in compromised chamber performance and increased maintenance, which would decrease yields and throughput of the deposition system.

SUMMARY OF THE INVENTION

The present invention provides a method and apparatus for efficient cleaning of a CVD or other type of processing chamber without the use of PFC gases or a plasma, between depositions of a layer, such as tungsten silicide, onto a substrate, such as a silicon wafer, in a chamber. The method of the present invention introduces diluted chlorine trifluoride ($ClF_3$) into a processing chamber to clean the chamber with a differential etch process. One aspect of the invention utilizes a difference in temperature between the areas with heavy deposits and the areas with lighter deposits. By heating the areas of the chamber with the heaviest deposits to the highest temperature while cooling areas with lighter deposits, the chamber is cleaned quickly, and with less overetching of chamber components. A second aspect of the invention achieves a differential etch by blanketing areas of the chamber that are delicate or have less deposits with a nonreactive gas during a portion of the cleaning process.

In one preferred embodiment of the method of the present invention, lamp heaters outside of the chamber heat a wafer susceptor to a temperature of 550° C. by shining light, including both visible and invisible light, through a quartz (silica) window while the chamber is purged with nonreactive gas. Purging is accomplished by flowing a nonreactive gas, such as argon, into the chamber while a throttle valve on a vacuum system attached to the chamber is open. The purge gas displaces and dilutes other species in the chamber, and both are carried away in the exhaust stream. The susceptor is then heated to a temperature of 475° C. and the chamber is pumped down for about 15 seconds, after which time the power to the heating lamps is set to low enough so that the lamps do not appreciably heat the substrate, but so that the lamp filament remains hot, thereby prolonging lamp lifetime. This condition is known as "idling" the lamps. A pump-down is accomplished by turing off the gas flow while leaving the throttle valve to the vacuum system open, which evacuates the system. After the pumpdown, diluted $ClF_3$ is introduced into the chamber, which is held at a pressure of about 3 torr for a total of about 200 seconds, and then the chamber is pumped down for another 15 seconds. The $ClF_3$ reacts with the unwanted deposits to form volatile compounds that are carried away through the chamber exhaust. Because the susceptor was heated to the highest temperature, it is at a higher temperature than other parts of the chamber and deposited material in this region is etched away at a higher rate than in the cooler areas.

These and other embodiments of the present invention, as well as its advantages and features are described in more detail in conjunction with the text below and attached figures.

DESCRIPTION OF THE PREFERRED EMBODIMENT

I. Introduction

The present invention allows for efficient cleaning of a CVD chamber after materials have been deposited in the chamber. The invention is suitable for, among other things, removing unwanted tungsten or tungsten silicide deposits and particles from the chamber after it has been used to deposit that material on several wafers. The invention uses diluted $ClF_3$ to etch unwanted deposits from heavily built-up areas, while protecting areas with less build-up from overetching. Because the cleaning operation occurs at a temperature close to the deposition temperature, little time is lost waiting for the chamber to cool down and heat up between the deposition and clean processes. After etching unwanted deposits, a silane-scavenging operation helps to clear the chamber of any residual $ClF_3$ before continuing with another wafer deposition sequence.

II. Exemplary CVD Reactor Chamber

Figure 1A:
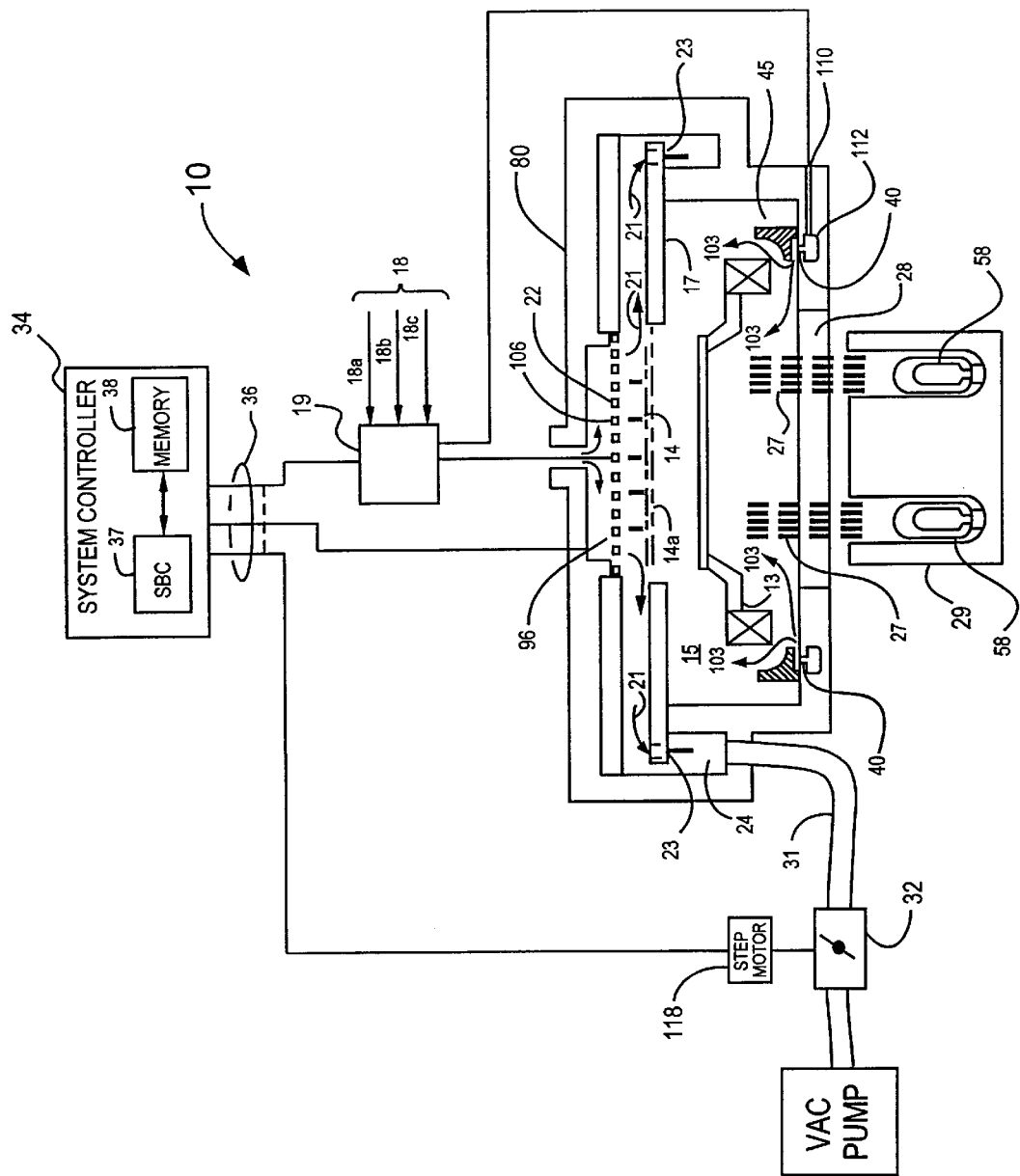
FIG. 1A is a vertical, cross-sectional view of one embodiment of a simplified chemical vapor deposition apparatus according to the present invention.
Figure 1B:
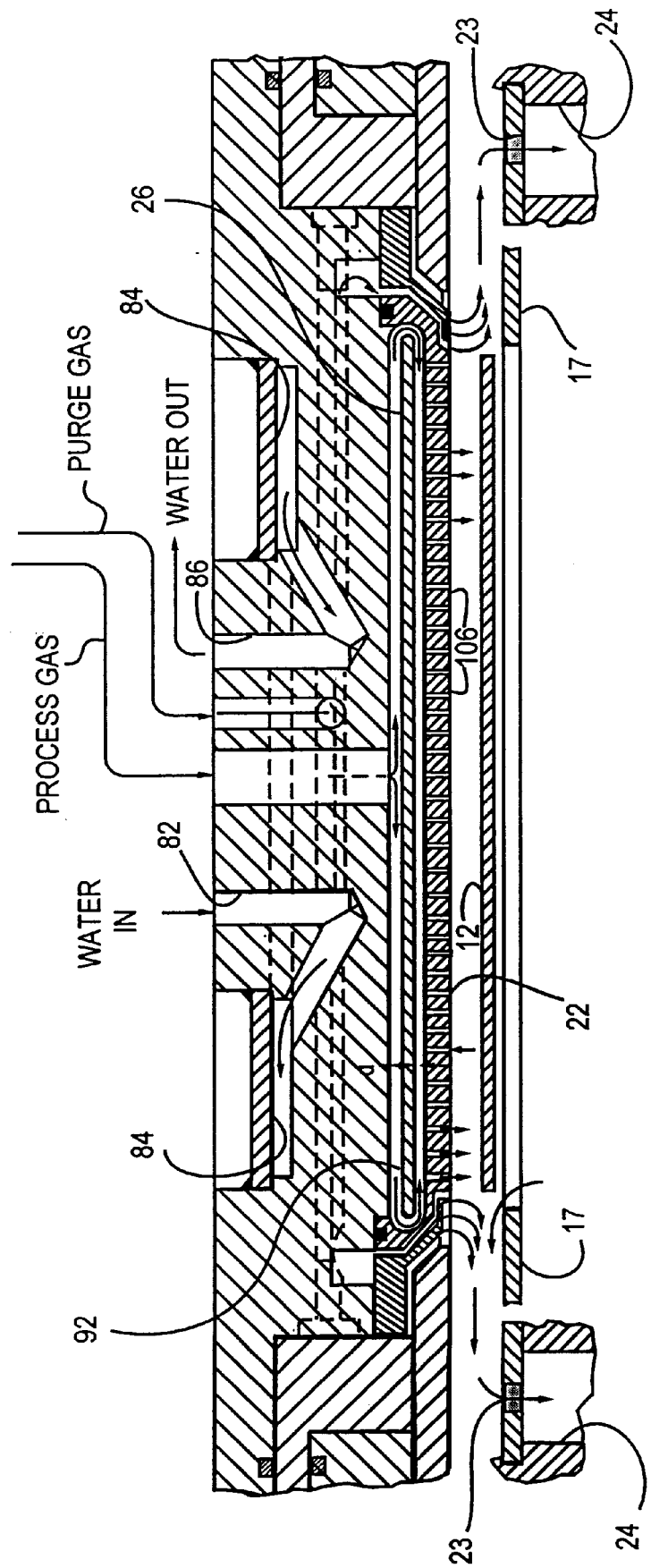
FIG. 1B is a more detailed cross-sectional view of the gas manifold shown in FIG. 1A.

FIG. 1A illustrates one embodiment of a simplified chemical vapor deposition (CVD) system 10 having a vacuum chamber 15 that, according to the present invention, can be used to deposit a layer onto a substrate. FIG. 1B is a more detailed drawing of some of the elements of deposition system 10. As shown in FIG. 1A, CVD system 10 contains a gas distribution manifold 106 for dispersing process gases through fine holes 96 in manifold faceplate 22 to a wafer (not shown) that rests on a susceptor 12. Susceptor 12 holds the wafers or other substrates being processed and is highly thermally responsive, both absorbing and conducting heat well. Glassy carbon, or preferably graphite, are suitable susceptor materials for some applications. It is mounted on supports 13 so that susceptor 12 (and any substrate supported on the upper surface of susceptor 12) can be moved controllably between a lower loading and off-loading position and an upper processing position 14 or a cleaning position 14a, which are closely adjacent to manifold 26. A centerboard (not shown) includes sensors for providing information on the position of the wafer.

When susceptor 12 and the wafer are in cleaning position 14a, they are surrounded by a baffle plate 17 having a plurality of ports 23 that exhaust into an annular vacuum manifold 24. Etchant, purge, and carrier gases are supplied through supply lines 18 into a gas panel 19 where they are then sent to manifold 26 and lower purge gas inlet 110. A second ring of lower gas nozzles 40, connected to annular ring 112, supply a flow of nonreactive gas 103 across window 28, around the perimeter of susceptor 12, and to the lower portion of chamber 15, to reduce overetching in these areas.

FIG. 1B more clearly shows manifold 26, gas blocker plate 92, and faceplate 22 with faceplate holes 106. FIG. 1B also shows other features of the gas manifold, such as cooling water inlet 82, cooling water annular channel 84, and cooling water outlet 86.

Figure 2:
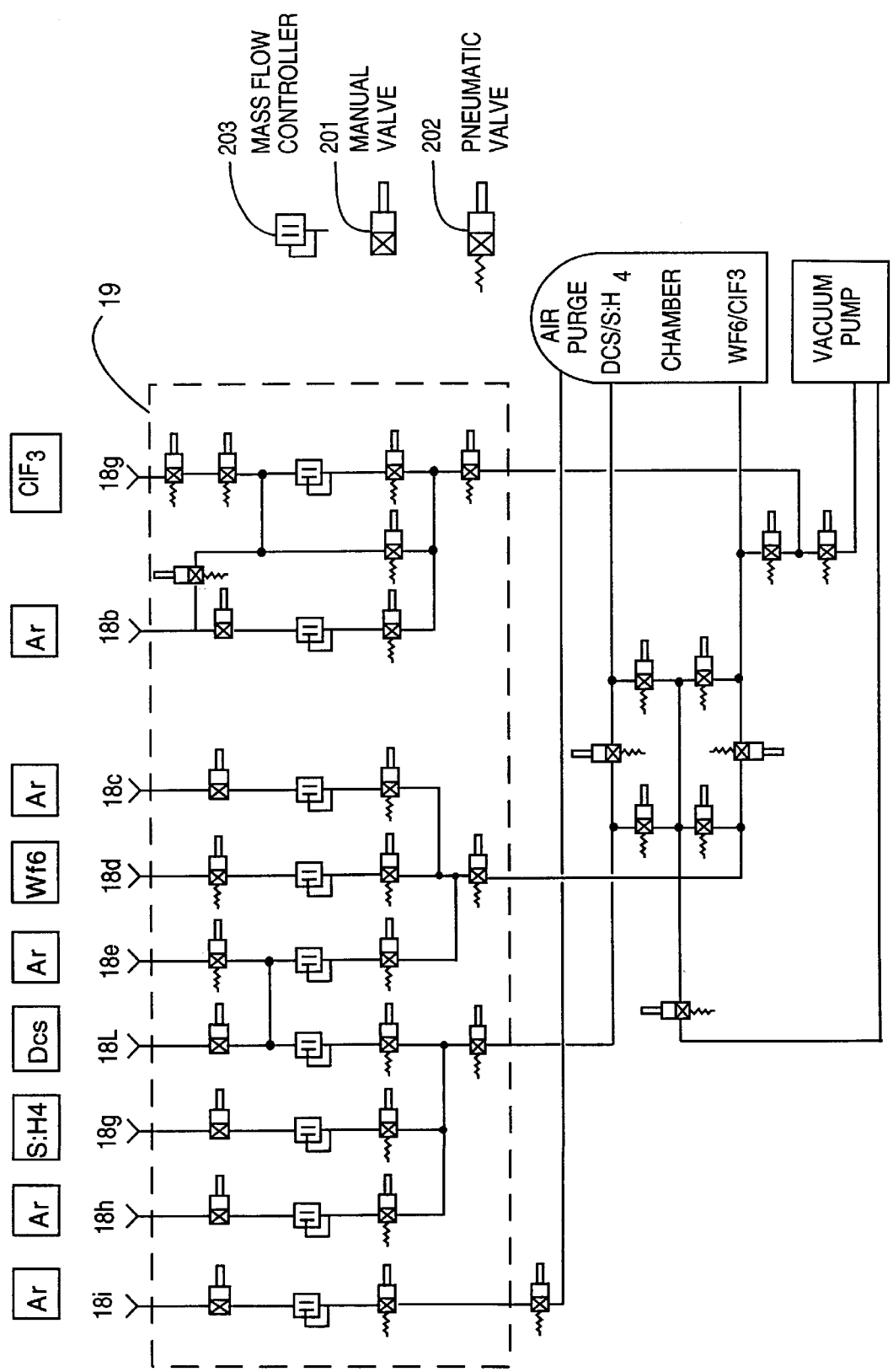
FIG. 2 shows one embodiment of a gas panel gas mixing system where the flows of gases into the chamber are controlled by mass flow controllers and valves.

FIG. 2 shows one possible configuration of gas panel 19. In this example, nine supply lines 18a–18i enter gas panel 19. Panel 19 is configured to control silane (line 18g), dichlorosilane (DCS) (line 18f), tungsten hexafluoride (WF$_6$) (line 18d), ClF$_3$ (line 18a), and five different argon lines (18b, 18c, 18e, 18h, and 18i). The supply line inputs may be turned on and off with either manual valves 201 or pneumatic valves 202. The pneumatic valves may be controlled by the system controller (not shown). The rate at which deposition and carrier gases are supplied from gas panel 19 to the gas manifold (not shown) is controlled by liquid or gas mass flow controllers 203 and/or by valves. Mass flow controllers (MFCs) 203 control the flow of the respective gases. Some of gas supply lines 18, e.g. purge line 18e, do not need to be controlled with a MFC, and instead may be configured without one. When toxic, flammable, or corrosive gases are used in the process, lockout valves prevent dangerous simultaneous gas flows.

Referring again to FIG. 1, gas supplied to manifold 26 is vented toward and uniformly distributed across the surface of the wafer in a radial laminar flow as indicated by arrows 21. Additionally, lower gas nozzles 40 supply nonreactive gas that blankets the backside of the susceptor and is drawn up through the small gap remaining between the susceptor 12 and baffle plate 17 toward ports 23 to carry reactive gases away from this area. An exhaust system then exhausts the gas via ports 23 into the annular vacuum manifold 24 and out exhaust line 31 by a vacuum pump system (not shown). The rate at which gases are released through exhaust line 31 is controlled by throttle valve 32.

Heat is distributed by an external lamp module 29 and reflector 45 External lamp heater module 29 provides a collimated annular pattern of visible and infrared light 27 from lamps 58 through a silica window 28 onto an annular outer peripheral portion of susceptor 12. Reflector 45 reflects heat back to the susceptor and improves the heating efficiency and distribution. Such heat distribution compensates for the natural heat loss pattern of the susceptor and provides rapid and uniform susceptor heating for deposition or cleaning. Alternatively, an electrical resistance heating system may be used instead of a lamp heating system. An electrical resistance heating system may include a heater assembly (not shown) containing an electrical heating element (not shown). The heating element may be configured to provide a heat output pattern that compensates for the natural heat loss pattern of the heater assembly, resulting in uniform substrate heating.

Although the chamber described above relates to a thermal deposition process, the invention is also applicable to a chamber that utilizes a plasma deposition process. In a plasma deposition process, either single or mixed frequency RF power ignites a plasma in a reaction zone of a substrate to facilitate deposition on the substrate. In such a process, it is advantageous that susceptor 12 be made from an electrically conductive material, such as graphite.

Typically, any or all of the chamber lining (not shown), gas distribution manifold faceplate 22, supports 13, and various other reactor hardware are made out of material such as aluminum or anodized aluminum. An example of such a CVD apparatus that includes many of the features described above is described in U.S. Pat. No. 4,892,753 entitled "Process For PECVD of Silicon Oxide Using TEOS Decomposition," issued to Wang et al., and assigned to Applied Materials, Inc., the assignee of the present invention, which is incorporated herein by reference for all purposes.

A motor (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 203 connected to supply lines 18, gas delivery system, throttle valve 32, and lamp magnet drivers are all controlled by a system controller 34 over control lines 36 of which only some are shown.

System controller 34 controls all of the activities of the CVD machine, which may have one or more deposition chambers 15. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate controller 34.

In a preferred embodiment, the system controller includes a hard disk drive (memory 38), a floppy disk drive, and a card rack. The card rack contains a single board computer (SBC) processor 37, analog and digital input/output boards, interface boards, and stepper motor controller boards. Various parts of CVD system 10 conform to the Versa Modular European (VME) standard that defines board, card cage, and connector dimensions and types. The VME standard also defines the bus structure as having a 16-bit data bus and 24-bit address bus.

Figure 3:
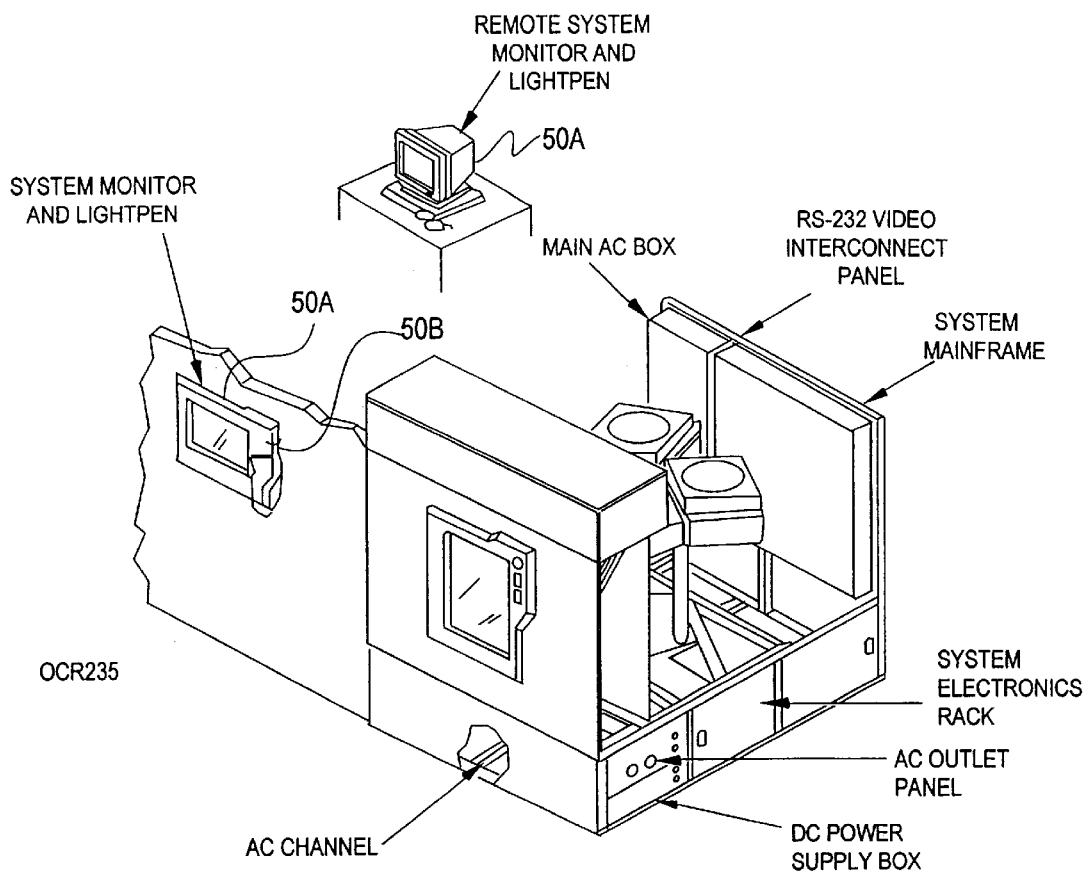
FIG. 3 is a simplified diagram of a system monitor of CVD system 10.

FIG. 3 shows a simplified diagram of the system monitor for CVD system 10, which may include one or more monitors 50a. The interface between a user and controller 34 is via a CRT monitor 50a and light pen 50b. In the preferred embodiment two monitors 50a are used, one mounted in the clean room wall for the operators and the other behind the wall for the service technicians. Both monitors 50a simultaneously display the same information, but only one light pen 50b is enabled. The light pen 50b detects light emitted by a CRT display with a light sensor in the tip of the pen. To select a particular screen or function, the operator touches a designated area of the display screen and pushes the button on the pen 50b. The highlighted color of the touched area changes, or a new menu or screen is displayed, confirming communication between the light pen and the display screen. Of course, other devices, such as a keyboard, mouse, or other pointing or communication device, may be used instead of or in addition to light pen 50b to allow the user to communicate with controller 34.

In one embodiment, the process for depositing a film or cleaning the chamber is implemented using a computer program product that is executed by controller 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of pre-compiled windows library routines. To execute the linked, compiled object code, the system user invokes the object code, causing the computer system to load the code in memory, from which the CPU reads and executes the code to perform the tasks identified in the program.

Figure 4:
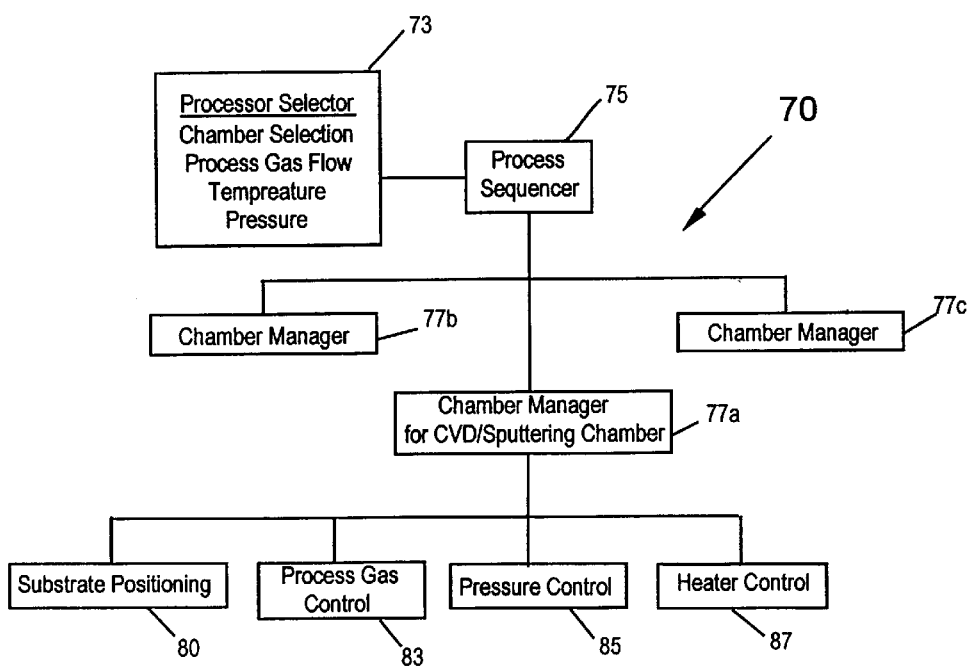
FIG. 4 is an illustrative block diagram of the hierarchical control structure of the system control software, computer program 70, according to a specific embodiment.

FIG. 4 is an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. Each process set configures the general CVD system to perform a particular operation. The process selector subroutine 73 identifies (i) the desired process chamber, and (ii) the desired set of process parameters needed to operate the process chamber for performing a specific process. The process parameters for performing a specific process relate to process conditions such as, for example, process gas composition and flow rates, temperature, pressure, cooling gas pressure, and chamber wall temperature and are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out.

Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c that controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, and heater control subroutine 87. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 4, which illustrates a structure of a controller. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 26. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the. chamber. For these processes, the process gas control subroutine 83 is programmed to include steps for flowing the inert gas into the chamber 15 for an amount of time necessary to stabilize the pressure in the chamber, and then the steps described above would be carried out.

The pressure control subroutine 85 comprises program code for controlling the pressure in the chamber 15 by regulating the size of the opening of a throttle valve 32 in the exhaust system of the chamber. The size of the opening of throttle valve 32 is set to control the chamber pressure to the desired level in relation to the total process gas flow, size of the process chamber, and pumping set-point pressure for the exhaust system. When the pressure control subroutine 85 is invoked, the desired, or target, pressure level is received as a parameter from the chamber manager subroutine 77a. Pressure control subroutine 85 operates to measure the pressure in chamber 15 by reading one or more conventional pressure manometers connected to the chamber, compare the measure value(s) with the target pressure, obtain PID (proportional, integral, and differential) values from a stored pressure table corresponding to the target pressure. Pressure control subroutine 85 then drives a stepper motor 118 to adjust throttle valve 32 according to the PID values obtained from the pressure table. Alternatively, pressure control subroutine 85 can be written to open or close throttle valve 32, via stepper motor 118, to a particular opening size to regulate chamber 15 to the desired pressure.

Heater control subroutine 87 comprises program code for controlling the temperature of the lamp module that is used to heat susceptor 12. The heater control subroutine 87 is also invoked by the chamber manager subroutine 77a and receives a target, or set point, temperature parameter. The heater control subroutine 87 measures the temperature by measuring the voltage output of a thermocouple located in susceptor 12, compares the measured temperature with the set-point temperature, and increases or decreases current applied to the lamp module 29 to obtain the set-point temperature. The temperature is obtained from the thermocouple voltage by looking up the corresponding temperature in a stored conversion table, or by calculating the temperature from the thermocouple voltage using a fourth-order polynomial. When radiant lamps are used to heat the susceptor 12, the heater control subroutine 87 gradually controls a ramp up/down of current applied to the lamp. The gradual ramp up/down of the current increases the life and reliability of the lamp. Additionally, a built-in fail-safe mode can be included to detect process safety compliance, and can shut down operation of the lamp module 29 if the process chamber 15 is not properly set up.

The above reactor description is mainly for illustrative purposes, and other CVD equipment such as other thermal CVD devices, electron cyclotron resonance (ECR) plasma CVD devices, induction-oupled RF high density plasma CVD devices, or the like may be employed. Additionally, variations of the above described system such as variations in susceptor design, heater design, and others are possible. For example, the wafer could be supported and heated by a resistively heated platen. The layer and method for forming such a layer of the present invention is not limited to any specific apparatus.

III. Cleaning the CVD Chamber Using a $ClF_3$ Etch

The method of the present invention may be employed to remove unwanted deposits of tungsten, tungsten silicide, titanium, titanium nitride, or silicon dioxide compounds from a substrate processing chamber, such as the exemplary CVD chamber described above. The method is particularly applicable to reduce cleaning time without subjecting system components to undue etching.

Tungsten silicide may be deposited in a multiple-step process from tungsten hexafluoride, silane, dichlorosilane, and other gases. The layer of tungsten silicide may be created on a substrate from a thermal reaction of the gases. The specifics of the deposition process is well known to those skilled in the art. The deposition of tungsten silicide is only one example of a deposition process that may result in unwanted build-up that needs to be cleaned from a deposition chamber.

Figure 5:
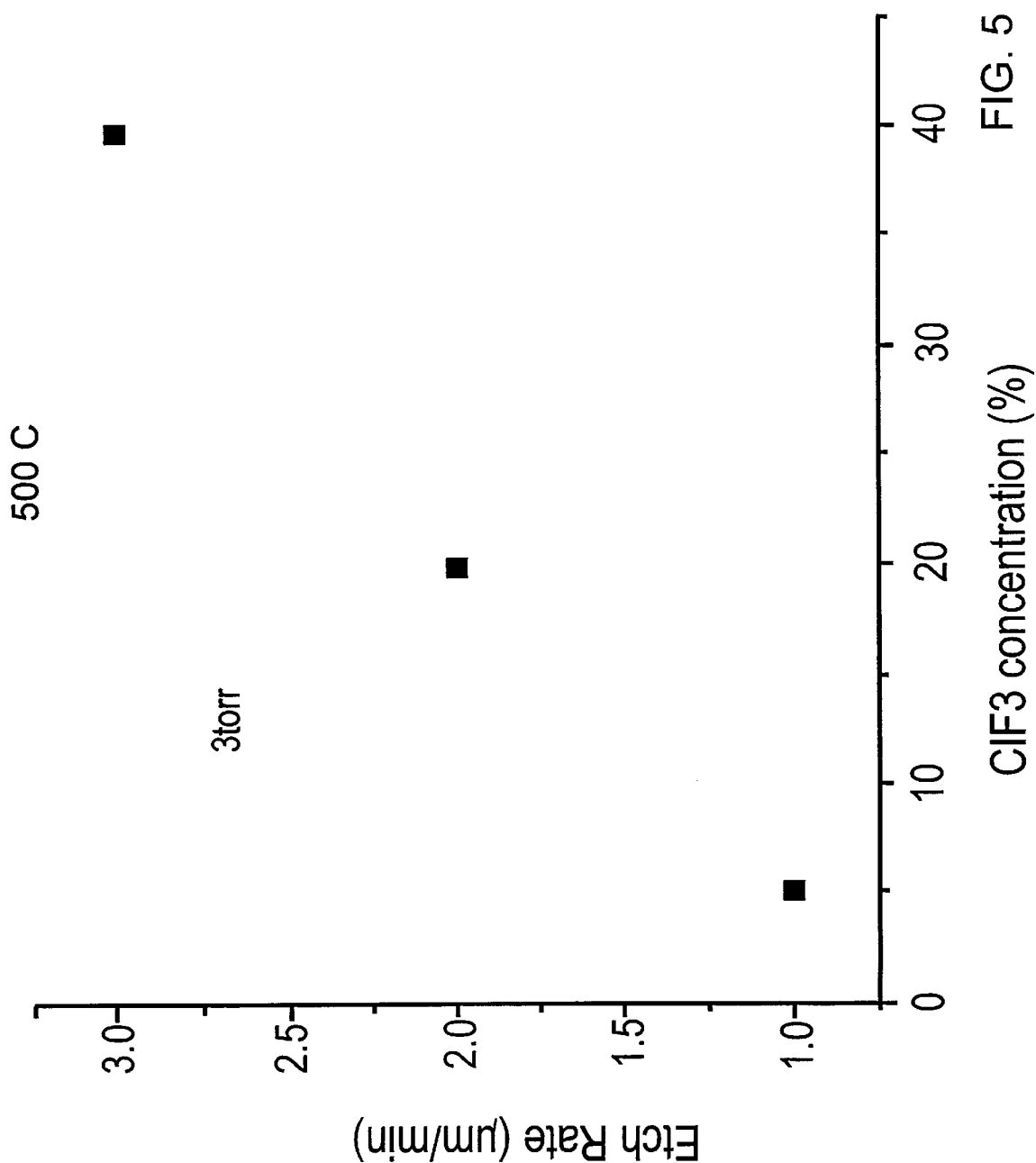
FIG. 5 is a graph showing the etch rate of tungsten silicide in micrometers per minute versus $ClF_3$ vapor concentration in argon by percent at a chamber pressure of 3 torr and a temperature of 500° C.

In the method of the present invention, chlorine trifluoride ($ClF_3$) vapor is diluted with an inert carrier gas and introduced into chamber 10 as a dry-clean step after completion of a deposition or other substrate processing step. Although other etchants may be used, $ClF_3$ is preferred because it efficiently etches many compounds. This may be because it contains both chlorine, which may etch titanium and titanium compounds, and fluorine, which may etch tungsten, tungsten compounds, and silicon dioxide compounds. The boiling point of $ClF_3$ is slightly below room temperature, so $ClF_3$ may be kept in the liquid phase in a pressuized container. A pressure regulator supplies pure $ClF_3$ vapor for dilution with another gas. Possible other gases include nitrogen ($N_2$), argon (Ar), neon (Ne) or helium (He), among others. The $ClF_3$ vapor is diluted with another gas or gases to between about 5% and 40% of the total gas concentration. FIG. 5 is a graph showing the etch rate of tungsten silicide versus the $ClF_3$ concentration at a fixed pressure of 3 torr. Preferably, the $ClF_3$ concentration is diluted to between about 15% and 25% of the carrier gas concentration.

The technique of the present invention may be employed to clean a chamber after every deposition or substrate processing operation step in a wafer run in that chamber, or may be employed after multiple wafers have been processed. The wafer typically is smaller than the susceptor, so a portion of the susceptor's surface is not covered by the wafer during deposition. Because succeptor 12 is about 25–75° C. hotter than the wafer being processed, the uncovered face of the susceptor will accumulate approximately 2,000 Å of tungsten silicide if a 1,500 Å layer is deposited on a wafer, for example. Tungsten silicide may also deposit on the edge and backside of susceptor 12, typically to a lessor degree than on the uncovered upper surface of susceptor 12 because the backside purge gas displaces some of the reactive gas. After a run of 25 wafers, each wafer receiving a layer of tungsten silicide approximately 1,500 Å thick, the upper surface of susceptor 12 will have approximately 50,000 Å of unwanted deposits on its uncovered upper surface.

However, because the gas manifold faceplate 22 is cooled to approximately 55–70° C., less than 1,000 Å accumulates on faceplate 22. Faceplate 22 has many fine holes in its surface, and it is important to keep these holes clean of deposits that may alter the gas flow characteristics from faceplate 22. Also, these fine holes are more susceptible to overetching than some other elements of the deposition chamber.

Figure 6:
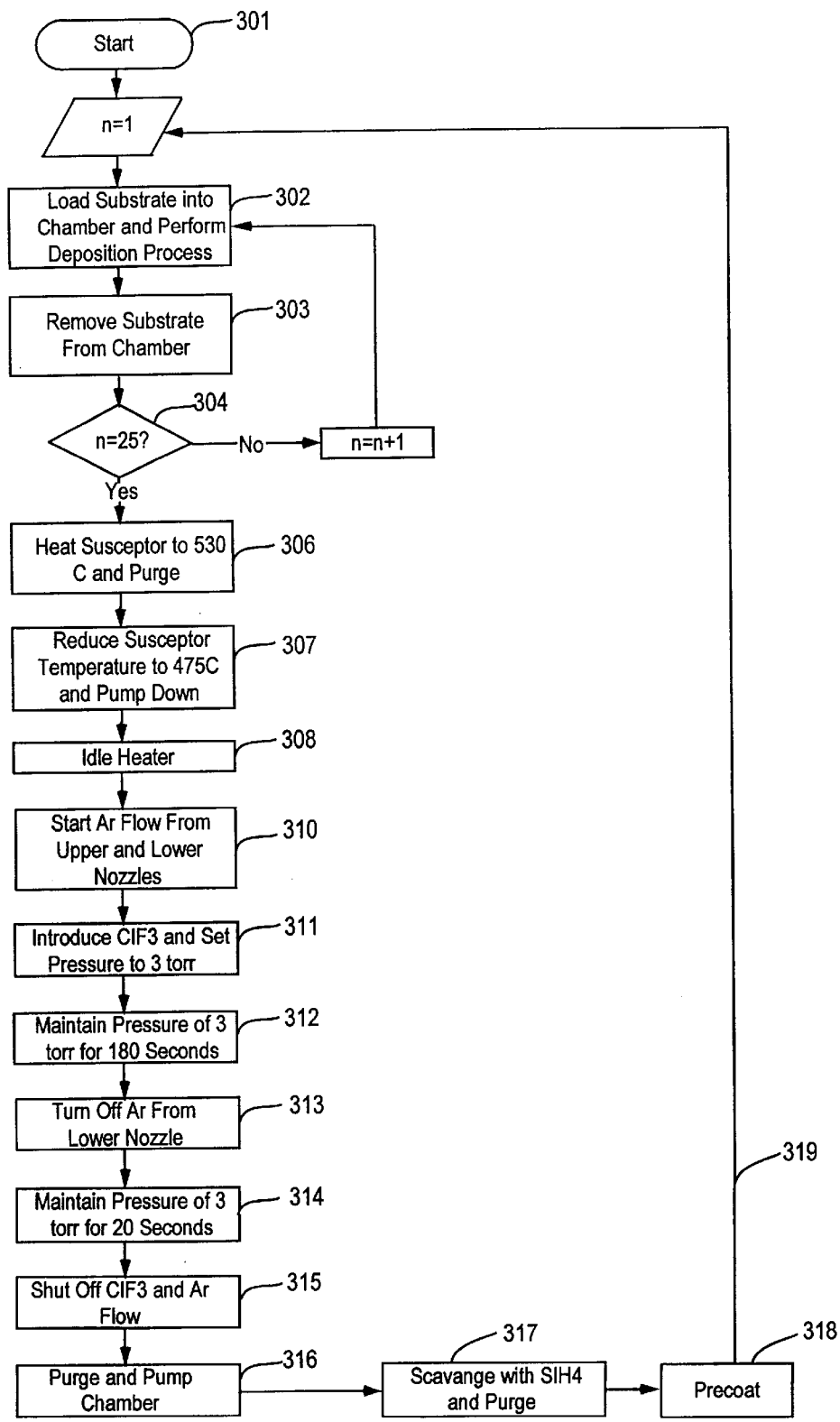
FIG. 6 is a flow chart illustrating the steps of a preferred embodiment of the present invention, as practiced between runs of wafer depositions.

FIG. 6 is a simplified flow chart of one preferred embodiment of the method of the present invention. Upon start of a wafer-deposition run (step 301), a substrate is loaded into the chamber and processed according a deposition process, such as the tungsten silicide deposition process described above, or by another processing operation (step 302). After completion of the substrate processing operation, the substrate is removed from the chamber (step 303) and a determination is made by controller 42 as to whether a clean step should be performed (step 304). The clean step is performed after every n substrates are processed. N may be 1 or greater than 1, but in this example n is preferably 25 for a chamber used to deposit tungsten silicide.

For cleaning the chamber in this preferred embodiment, lamps 58 heat susceptor 12 to a temperature of 530° C. while the chamber is purged (step 306). During this step, argon gas flowing through the dichlorosilane (DCS) delivery line purges that line of residual DCS and silane (refer to FIG. 2, gas delivery lines 18*f*, 18*g*, and 18*h*). The chamber is then pumped down while the temperature of susceptor is set to 475° C. (step 307). After that, the heater control loop is disabled and the heater lamps are idled at a fixed 6% of full power (step 308). This is known as "idling" the heater and essentially inactivates the heater, that is, it is similar to turning the heater completely off as far as heat transfer to the susceptor is concerned. In other embodiments, a different percentage of power may be used, depending on the type of lamps, widows (including the degree of fogging), type of susceptor, age of the lamps, etc. Furthermore, the control loop could be designed to provide at least a minimum power to the lamps at all times, for example, providing 6% power when the set point is much lower than the control (measured operating) point. This would provide the same function of inactivating the heater as disabling the loop (described above) would, without actually disabling the loop. Embodiments incorporating different heating systems, such as resistively-heated systems, may inactivate the heater in other fashions, including turning the heater off.

While lamp heaters could be turned off as well, idling the heater extends the lifetime of the heat lamps by keeping the lamp filaments at an elevated temperature without radiating significant energy to the susceptor and other chamber components. This minimizes the cyclic stress associated with thermal cycling that would result if the lamps were turned completely off and allowed to cool to ambient temperature. It is estimated that the temperature of an idled filament is between about 800° C. and about 1200° C. Of course, some energy will radiate from the filament to the susceptor, but at idling filament temperatures, no significant heating of the susceptor by the lamp occurs. It is particularly noted that idling the heater does not affect the cleaning process and is not necessary to perform cleaning. Therefore, the heater may be turned off entirely at this point of the process.

The argon gas used to dilute the $ClF_3$ is then flowed into the chamber at a rate of 800 sccm, with an additional 700 sccm of argon emanating from lower gas nozzles 40 while throttle valve 32 remains open (step 310). After 15 seconds, the chamber pressure is set to 3 torr and 200 sccm of $ClF_3$ is diluted with 800 sccm of argon, the flow from lower gas nozzles 40 remaining at 700 sccm (step 311). This condition is held for 180 seconds (step 312), after which time the lower purge flow is turned off (step 313). This sequence blankets the lower portion of the chamber, which may have lighter deposits, with a non-reactive purge gas, thus protecting the lower portion from overetching, while the upper portion of the chamber, which may have heavier deposits, is exposed to the cleaning gas. Of course, this sequence could be inverted to achieve the same effect. That is, the lower purge could be off during the onset of the cleaning gas, and later turned on to protect the lower portion of the chamber. The pressure within the chamber is held at 3 torr for an additional 20 seconds with a flow of 800 sccm dilution argon and 200 sccm $ClF_3$ (step 314). Then, the gases are turned off (step 315) and the chamber is pumped down (step 316).

This process up to this point is sumarized in Table 1 below. It may be desirable to introduce silane ($SiH_4$) into the chamber, after the cleaning steps described above, to scavenge residual $ClF_3$ (step 317). Additionally, the susceptor and processing zone of the chamber may be precoated with a thin, even layer of titanium disilicide (step 318) to reduce chemical and particulate contamination of substrates during processing. After the purging and precoating steps, a new series of wafer deposition steps may begin (step 319).

near the area with the greatest build-up. More importantly, window 28 and reflector 45 arm both relatively cool, and therefore the etch rate in these regions is less than at the susceptor. This is important because both window 28 and reflector 45 are sensitive to overetching. If the surface of either structure is degraded by overetching, the heating system will not work as effectively and the parts may have to be replaced. This would result in a loss of wafer throughput as the deposition system is repaired, in addition to the cost of the replacement parts.

In cleaning unwanted tungsten silicide deposits, a chamber pressure of about 3–12 torr and a chamber temperature of 475–550° C. at the susceptor provides preferred conditions and sufficient etch rates in a lampheated MCVD chamber manufactured by Applied Materials. Different temperatures and pressure levels may be used and may be desirable in certain situations. For example, in cleaning deposited polysilicon material, temperatures up to around 700° C. or more may be employed because of the increased temperature at which polysilicon is deposited. As another example, in cleaning unwanted silicon, silicon oxide, or silicon nitride deposition material, temperatures up to 700–850° C. may be employed.

The duration of the clean step depends on the amount of residue and particles that have built up within the chamber. Preferably, the duration of the clean step is selected so that substantially all particulate matter and residue is removed from within the chamber. The rate at which $ClF_3$ is introduced is chosen as a trade-off between gas cost and etching time. Generally, the rate will be about 200 sccm of $ClF_3$. At 200 sccm $ClF_3$, the gas flow into the chamber is 1000 sccm for a 20% concentration, in addition to another 700 sccm of argon flowing into the chamber from the bottom purge vent. The actual flow rate of both the $ClF_3$ and inert gas will vary with chamber volume.

As previously stated, the method of the present invention is not limited to removing material deposited within a chamber from the above exemplary tungsten silicide process. Instead, the present invention is equally applicable to

TABLE 1

Periodic $ClF_3$ Clean Recipe for Every 25 Wafers

| | | | | | | Gas | | | | |
|---|---|---|---|---|---|---|---|---|---|---|
| Step | Title | Time (sec) | Press Set Pt. (% open/torr) | Temp (° C.) | Power Cont[2] | Ar Top (sccm) | Ar DCS[3] (sccm) | Ar ($ClF_3$) | $ClF_3$ (sccm) | Ar Bott (sccm) |
| 1 | Purge M | 20 | TVO[1] | 530 | — | 500 | 500 | 0 | 0 | 500 |
| 2 | Pump | 15 | TVO | 530 | — | 0 | 0 | 0 | 0 | 0 |
| 3 | Purge S | 500 | TVO | <480 | — | 500 | 500 | 0 | 0 | 500 |
| 4 | Pump | 15 | TVO | 475 | — | 0 | 0 | 0 | 0 | 0 |
| 5 | $ClF_3$ Ar on | 15 | TVO | — | 6% | 0 | 0 | 800 | 0 | 700 |
| 6 | $ClF_3$ Clean | 180 | 3T | — | 6% | 0 | 0 | 800 | 200 | 700 |
| 7 | $ClF_3$ Clean | 20 | 3T | — | 6% | 0 | 0 | 800 | 200 | 0 |
| 8 | Pump | 15 | TVO | 400 | — | 0 | 0 | 0 | 0 | 0 |

[1]TVO = Throttle Valve Open
[2]Power cont. = lamp power controlled by percentage output directly. In steps 1–4 and 8, the heater power is supplied by a temperature controller according to the difference between the set point and the measured heater temperature. In steps 5–7, the control loop is disabled and a fixed value of heater power is applied, regardless of actual heater temperature.
[3]"Ar DCS" refers to argon that is flowed through the dichlorosilane/silane delivery line to purge the line between the gas panel and deposition chamber of residual silane and dichlorosilane. A further understanding of this aspect may be obtained by reference to FIG. 2.

It is important to note that susceptor 12 typically has the greatest amount of build-up, and that susceptor 12 also is the hottest portion of the chamber during the clean process, due both to the fact that it was heated directly preceding the clean and also because it has a relatively high thermal capacity. This means that an increased etch rate is present cleaning material from tungsten silicide CVD processes that employ other precursor gases. The $ClF_3$ chemistry of the present invention is also applicable to cleaning material deposited during the deposition of silicon nitride, doped or undoped polysilicon, and tungsten, in addition to other materials.

IV. Test Results and Measurements

To demonstrate the operation of the apparatus and method according to the present invention, experiments were performed measuring the etch rate of tungsten silicide as a function of temperature. The experiments were performed in a lamp-heated MCVD chamber manufactured by Applied Materials and outfitted for 200-mm wafers.

Figure 7:
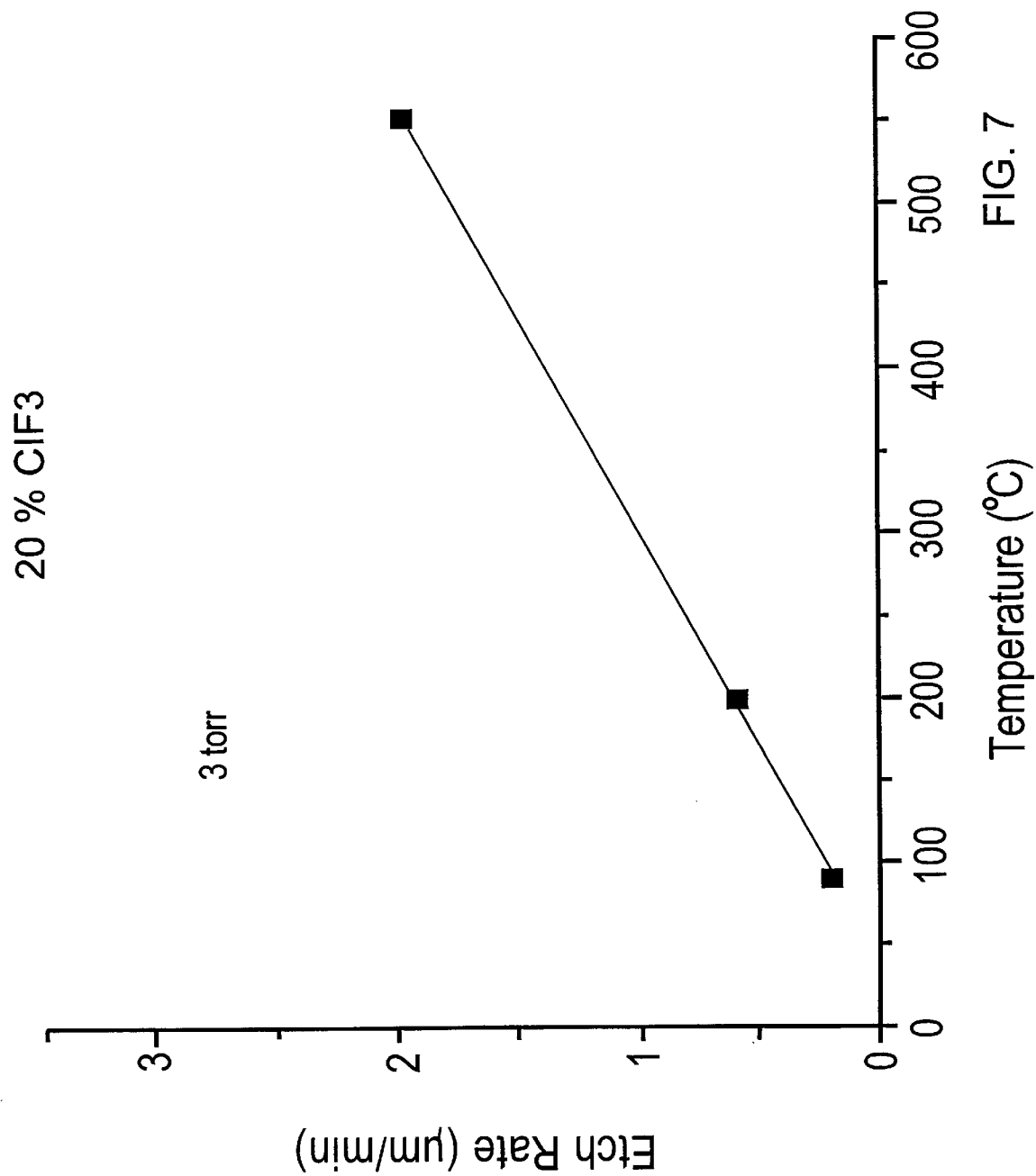
FIG. 7 is a graph showing the etch rate of tungsten silicide in microns per minute versus temperature in ° C. for 20% $ClF_3$ vapor in argon at a chamber pressure of 3 torr.

FIG. 7 is a graph of the etch rate of deposited tungsten silicide in μm per minute versus the temperature of the susceptor in degrees centigrade at a constant chamber pressure and gas concentration. In a first set of experiments, a substrate having a previously deposited layer of tungsten silicide was situated in the chamber and a gas containing approximately 20% $ClF_3$ vapor and 80% Ar was introduced into the chamber. Pressure within the chamber was set and maintain at 3 torr. The etch rate was determined by measuring the thickness of the tungsten silicide layer before and after exposure to the $ClF_3$ gas for a period of time. Thickness measurements were made with a profilometer, as understood by a person of ordinary skill in the art.

This invention utilizes the temperature dependance of the etch rate by cooling some portions of the chamber during the cleaning process to reduce the etch rate in those regions. For example, lid 32 of gas manifold 26 has channels 82, 84, 86 that convey cooling water through lid 32. This cooling water may be run open loop, or it may be controlled by according to a feedback loop based on a measured temperature of the water or the lid. The manifold faceplate 22 has many small holes in it, and is sensitive to overetching that might distort these holes. Because faceplate 22 is in contact with the cooled lid, the surface of faceplate 22 is cooled to a temperature between 55–70° C. when susceptor 12 is at a temperature of 550° C. Therefore, when the $ClF_3$ is admitted into the chamber, there is a temperature difference of over 400° C. between susceptor 12 and faceplate 22. As seen in FIG. 7, this results in a reduced etch rate at faceplate 22, protecting it from overetching. Similarly, this invention utilizes a nonetchant gas to achieve a differential etch that protects some parts of the chamber from overetching. Even though window 28 and reflector 45 are located underneath the susceptor, some unwanted deposition occurs in these areas. Window 28 and reflector 45 require clean surfaces to operate efficiently. Also, their surfaces are vulnerable to degradation by etching. A differential etch is achieved by flowing a blanketing gas over these parts while other, more heavily deposited, areas of the chamber are cleaned. The blanketing gas physically displaces and dilutes the etchant gas in these areas. As seen in FIG. 5, a lower concentration results in a lower etch rate. After most of the heavy deposits have been removed, the flow of blanketing gas is halted, allowing the etchant gas to clean the remaining areas of the chamber. The order of the sequence is not important.

Having fully described an embodiment of the present invention, other equivalent or alternative methods of cleaning a processing chamber according to the present invention will be apparent to those skilled in the art. These equivalents and alternatives are intended to be included within the scope of the present invention.

What is claimed is:

1. A method of processing a substrate in a chamber, said method comprising the steps of:

(a) depositing a layer on the substrate in the chamber;

(b) removing the substrate from the chamber;

(c) heating a first portion of the chamber to a first temperature with a heater;

(d) inactivating said heater; and (e) flowing an etchant gas comprising chlorine trifluoride ($ClF_3$) into the chamber to remove a residue from inside of the chamber while inactivating said heater.

2. An integrated circuit electronic device made by the method of claim 1.

3. A method for fabricating an integrated circuit in a processing chamber, the method comprising the steps of:

(a) introducing a wafer into the chamber;

(b) performing a processing operation on said wafer in the chamber such that unwanted residue from said processing operation is deposited on areas of the chamber;

(c) removing said wafer from the chamber;

(d) heating a first portion of the chamber to a temperature of at least about 400° C. while cooling a second portion of the chamber to at least less than about 200° C.;

(e) flowing an etchant gas comprising chlorine trifluoride ($ClF_3$) into the chamber; and (f) setting and maintaining a pressure within said chamber of less than at least 12 torr.

4. The method of claim 3 wherein said processing operation comprises a chemical vapor deposition of tungsten silicide, tungsten, or a combination thereof.

5. The method of claim 3 wherein said processing operation comprises a chemical vapor deposition of titanium, titanium nitride, silicon dioxide, or combinations thereof.

* * * * *